(12) United States Patent
Buxbaum et al.

(10) Patent No.: US 7,077,973 B2
(45) Date of Patent: *Jul. 18, 2006

(54) METHODS FOR SUBSTRATE ORIENTATION

(75) Inventors: Alex Buxbaum, Portland, OR (US); Bjorn Skyberg, Newberg, OR (US)

(73) Assignee: Applied Materials, Inc., Santa Clara, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 10/418,673

(22) Filed: Apr. 18, 2003

(65) Prior Publication Data

US 2004/0209477 A1    Oct. 21, 2004

(51) Int. Cl.
  *C23F 1/00* (2006.01)
(52) U.S. Cl. .................. 216/75; 216/79; 438/742; 438/743; 430/318
(58) Field of Classification Search ......... 216/67, 216/75, 79; 430/5, 313, 314, 318; 438/706, 438/710, 714, 720, 723
See application file for complete search history.

(56) References Cited

U.S. PATENT DOCUMENTS

| | | | |
|---|---|---|---|
| 4,350,563 A | 9/1982 | Takada et al. | |
| 4,406,733 A | 9/1983 | Tachi et al. | |
| 4,504,574 A | 3/1985 | Meyer et al. | |
| 4,586,743 A | 5/1986 | Edwards et al. | 294/86.4 |
| 4,600,686 A | 7/1986 | Meyer et al. | |
| 4,705,951 A | 11/1987 | Layman et al. | 250/442.1 |
| 4,813,732 A | 3/1989 | Klem | 294/103.1 |
| 5,022,695 A | 6/1991 | Ayers | 294/88 |
| 5,133,635 A | 7/1992 | Malin et al. | 414/744.8 |
| 5,180,276 A | 1/1993 | Hendrickson | 414/752 |
| 5,280,983 A | 1/1994 | Maydan et al. | 294/119.1 |
| 5,324,155 A | 6/1994 | Goodwin et al. | 414/225 |
| 5,374,147 A | 12/1994 | Hiroki et al. | 414/217 |
| 5,469,035 A | 11/1995 | Lowrance | 318/568.1 |
| 5,514,498 A * | 5/1996 | Nakagawa | 430/5 |
| 5,538,816 A | 7/1996 | Hashimoto et al. | |
| 5,580,388 A | 12/1996 | Moore | 118/728 |
| 5,647,626 A | 7/1997 | Chen et al. | 294/87.1 |
| 5,688,415 A * | 11/1997 | Bollinger et al. | 219/121.41 |
| 5,702,228 A | 12/1997 | Tamai et al. | 414/744.5 |
| 5,720,590 A | 2/1998 | Hofmeister | 414/744.2 |
| 5,733,096 A | 3/1998 | Van Doren et al. | 414/744.3 |
| 5,750,290 A | 5/1998 | Yasuzato et al. | |

(Continued)

FOREIGN PATENT DOCUMENTS

DE    27 01 458    1/1977

(Continued)

OTHER PUBLICATIONS

Rossnagel et al., Handbook of Plasma Processing, 1990, Noyes Publications, p. 198.*

(Continued)

*Primary Examiner*—Nadine G Norton
*Assistant Examiner*—Eric B. Chen
(74) *Attorney, Agent, or Firm*—Patterson & Sheridan LLP (57) ABSTRACT

Method and apparatus for etching a metal layer disposed on a substrate, such as a photolithographic reticle, are provided. In one aspect, a method is provided for processing a photolithographic reticle including positioning the reticle in a first orientation on a reticle support in a processing chamber, wherein the reticle comprises a metal photomask layer formed on an optically transparent substrate, and a patterned resist material deposited on the metal photomask layer, etching the metal photomask layer in the first orientation, positioning the reticle in at least a second orientation, and etching the metal photomask layer in the at least second orientation.

19 Claims, 4 Drawing Sheets

U.S. PATENT DOCUMENTS

| | | | |
|---|---|---|---|
| 5,773,199 A | 6/1998 | Linliu et al. | |
| 5,861,233 A | 1/1999 | Sekine et al. | |
| 5,948,570 A | 9/1999 | Kornblit et al. | |
| 5,994,235 A | 11/1999 | O'Donnell | |
| 6,007,732 A | 12/1999 | Hashimoto et al. | |
| 6,033,979 A | 3/2000 | Endo | |
| 6,037,265 A | 3/2000 | Mui et al. | |
| 6,080,529 A | 6/2000 | Ye et al. | |
| 6,114,250 A | 9/2000 | Ellingboe et al. | |
| 6,214,637 B1 | 4/2001 | Kim et al. | |
| 6,251,217 B1 | 6/2001 | Ye et al. | 156/345 |
| 6,307,265 B1 | 10/2001 | Anand et al. | |
| 6,322,312 B1 | 11/2001 | Sundar | 414/744.5 |
| 6,391,790 B1* | 5/2002 | Stoehr et al. | 438/715 |
| 6,391,791 B1 | 5/2002 | Sasaki et al. | |
| 6,451,697 B1 | 9/2002 | Sun et al. | 438/691 |
| 6,472,107 B1 | 10/2002 | Chan | |
| 6,534,417 B1* | 3/2003 | Stoehr et al. | 438/715 |
| 6,537,011 B1 | 3/2003 | Wang et al. | 414/217 |
| 6,635,185 B1 | 10/2003 | Demmin et al. | |
| 6,709,901 B1 | 3/2004 | Yamazaki et al. | |
| 6,960,413 B1 | 11/2005 | Brooks et al. | |
| 2003/0003374 A1* | 1/2003 | Buie et al. | 430/5 |
| 2003/0049934 A1 | 3/2003 | Buie et al. | |
| 2004/0000535 A1 | 1/2004 | Mueller et al. | |
| 2005/0008945 A1 | 1/2005 | Brooks et al. | |

FOREIGN PATENT DOCUMENTS

| | | |
|---|---|---|
| EP | 0 054 736 | 6/1982 |
| EP | 0 423 608 A1 | 4/1991 |
| EP | 0 793 262 A2 | 9/1997 |
| EP | 0 840 358 | 5/1998 |
| EP | 0 978 870 | 2/2000 |
| EP | 0 999 472 | 5/2000 |
| JP | 60-016422 | 1/1985 |
| JP | 60-219748 | 11/1985 |
| JP | 10-74814 | 3/1998 |
| JP | 11008291 | 1/1999 |
| JP | 11-131263 | 5/1999 |
| JP | 2001-33940 | 6/2003 |
| WO | WO 99/23691 | 5/1999 |
| WO | WO 00/67281 | 11/2000 |
| WO | WO 01/96955 | 12/2001 |

OTHER PUBLICATIONS

Popov, High Density Plasma Sources—Design, Physics and Performance, 1995, Noyes Publications, p. 95-96.*

Wolf et al., Silicon Processing for the VLSI Era, 1986, Lattice Press, vol. 1, pp. 477-479.*

Wolf et al., Silicon Processing for the VLSI Era, 1986, Lattice Press, vol. 1, p. 480.*

PCT Partial International Search Report from PCT/US 01/07932, Dated Sep. 18, 2001.

Aoyama, et al. "Advanced Cr Dry Etching Process" SPIE Symposium on Photomask and X-Ray Technology VI, Yokohama, Japan, Sep. (1999) SPIE, vol. 3748 pp. 137-146.

Fujisawa, et al. "Evaluation of NLD Mask Dry Etching System" SPIE Symposium on Photomask and X-Ray Technology VI, Yokohama, Japan, Sep. (1999) vol. 3748 pp. 147-152.

Kwon, et al., "Loading Effect Parameters at Dry Etcher System and Their Analysis at Mask-to-Mask Loading and Within-Mask Loading" Proceedings of SPIE, vol. 4562 (2002) pp. 79-87.

Miyashita, et al., "Manufacturing of Half-Tone Phase Shift Masks: II. Writing and Process", Proceedings of the SPIE—The International Society for Optical Engineering USA, vol. 2254, 1994, pp. 248-260.

Mohri, et al., "Manufacturing of Half-Tone Phase Shift Masks: I. Blank" Proceedings of the SPIE—The International Society for Optical Engineering USA, vol. 2254, 1994, pp. 238-247.

PCT International Search Report dated Feb. 14, 2005 for PCT/US2004/008335.

PCT International Search Report for PCT/US 01/19282, dated May 31, 2002.

PCT International Search Report from International Application No. PCT/US02/27869, Dated Dec. 23, 2002.

PCT Search Report for PCT/US03/11549, dated Feb. 19, 2004.

PCT Written Opinion dated Feb. 14, 2005 for PCT/US2004/008335.

Ruhl, et al. "Chrome Dry Etch Process Characterization Using Surface Nano Profiling" Proceedings of SPIE, vol. 4186 (2001) pp. 97-107.

* cited by examiner

METHODS FOR SUBSTRATE ORIENTATION

BACKGROUND OF THE INVENTION

1. Field of the Invention

The present invention relates to the fabrication of integrated circuits and to the fabrication of photolithographic reticles useful in the manufacture of integrated circuits.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.15 µm and even 0.13 µm feature sizes, and tomorrow's plants soon will be producing devices having even smaller geometries.

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates.

High aspect ratio features are conventionally formed by using photolithography to pattern a surface of a substrate to define the dimensions of the features and then etching the substrate to remove material and define the features. To form high aspect ratio features with a desired ratio of height to width, the dimensions of the features are required to be formed within certain parameters, which are typically defined as the critical dimensions of the features. Consequently, reliable formation of high aspect ratio features with desired critical dimensions requires precise patterning and subsequent etching of the substrate.

Photolithography is a technique used to form precise patterns on the substrate surface by transferring patterns from a photolithographic reticle to a substrate surface by light passing therethrough. Photolithographic reticles typically include a substrate made of an optically transparent material, such as quartz (i.e., silicon dioxide, $SiO_2$), having an opaque light-shielding layer, or photomask, typically a metal, such as chromium, disposed on the surface of the substrate. The light-shielding layer is patterned to correspond to the features to be transferred to the substrate. Generally, conventional photolithographic reticles are fabricated by first depositing a thin metal layer on a substrate comprising an optically transparent material, such as quartz, and depositing a resist layer on the thin metal layer. The resist is then patterned using conventional laser or electron beam patterning equipment to define the critical dimensions to be transferred to the metal layer. The metal layer is then etched to remove the metal material not protected by the patterned resist; thereby exposing the underlying material and forming a patterned photomask layer. Photomask layers allow light to pass therethrough in a precise pattern onto the substrate surface.

Conventional etching processes, such as wet etching, tend to etch isotropically, which can result in an undercut phenomenon in the metal layer below the patterned resist. The undercut phenomenon can produce patterned features on the photomask that are not uniformly spaced and do not have desired straight, vertical sidewalls that are necessary to produce the critical dimensions of the features. Additionally, the isotropic etching of the features may overetch the sidewalls of features in high aspect ratios, resulting in the loss of the critical dimensions of the features. Features formed without the desired critical dimensions in the metal layer can detrimentally affect light passing therethrough and result in less than desirable patterning by the photomask in subsequent photolithographic processes.

Plasma etch processing, known as dry etch processing or dry etching, provides an alternative to wet etching and provides a more anisotropic etch than wet etching processes. In conventional dry etching processing, a plasma of etching gases is used to etch the metal layers formed on the substrate. The dry etching process has been shown to produce less undercutting and improve the retention of the critical dimensions of the photomask features with straighter sidewalls and flatter bottoms than wet etching processes.

However, it has been observed that dry etching of the reticles, which are generally square in shape, may provide variable or non-uniform etching of similar features disposed in the metal layer and located at different locations on the reticle surface. It is believed that one factor that arises in this substrate or global non-uniformity of etching features is due to the asymmetry of dry etching process chambers. For example, the location of apparatus components, such as gas inlets and pump ports have been observed to affect the uniformity of gas distribution in and exhaustion from the chamber, and coil placement has been observed to affect the uniformity of plasma formation. However, redesigning chambers is a costly and time consuming process of trial and error to remove or minimize process variations.

Therefore, there remains a need for processes for etching a photomask layer on a photolithographic reticle that produces more uniform global critical dimensions of features formed in the photomask layer.

SUMMARY OF THE INVENTION

Aspects of the invention generally provide methods for etching a metal layer deposited on an optically transparent substrate, such as a photolithographic reticle. In one aspect, a method is provided for processing a photolithographic reticle including positioning the reticle in a first orientation on a reticle support in a processing chamber, wherein the reticle comprises a metal photomask layer formed on an optically transparent substrate and a patterned resist material deposited on the metal photomask layer, etching the metal photomask layer in the first orientation, positioning the reticle in at least a second orientation, and etching the metal photomask layer in the at least second orientation. The repositioning of the reticle may be performed in situ and/or also be performed manually or automatically.

In another aspect, a method is provided for processing a photolithographic reticle including positioning the reticle in a processing chamber, etching the reticle, varying the orientation of the reticle from a first orientation to at least a second orientation.

In another aspect, a method is provided for processing a photolithographic reticle including etching the reticle in a first orientation, etching the reticle in at least a second orientation, overetching the reticle in at least the first orientation or the second orientation.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE EXEMPLARY EMBODIMENT

Aspects of the invention will be described below in reference to an inductively coupled plasma etch chamber. Suitable inductively coupled plasma etch chambers include the TETRA™ photomask etch chambers available from ETEC of Hayward, Calif., or optionally, the Decoupled Plasma Source (DPS™) chamber available from Applied Materials, Inc., of Santa Clara, Calif. Other process chambers may be used to perform the processes of the invention, including, for example, capacitively coupled parallel plate chambers and magnetically enhanced ion etch chambers as well as inductively coupled plasma etch chambers of different designs. Although the processes are advantageously performed with the ETEC TETRA™ photomask etch chamber, the description in conjunction with the DPS™ processing chamber is illustrative, and should not be construed or interpreted to limit the scope of aspects of the invention.

Figure 1:
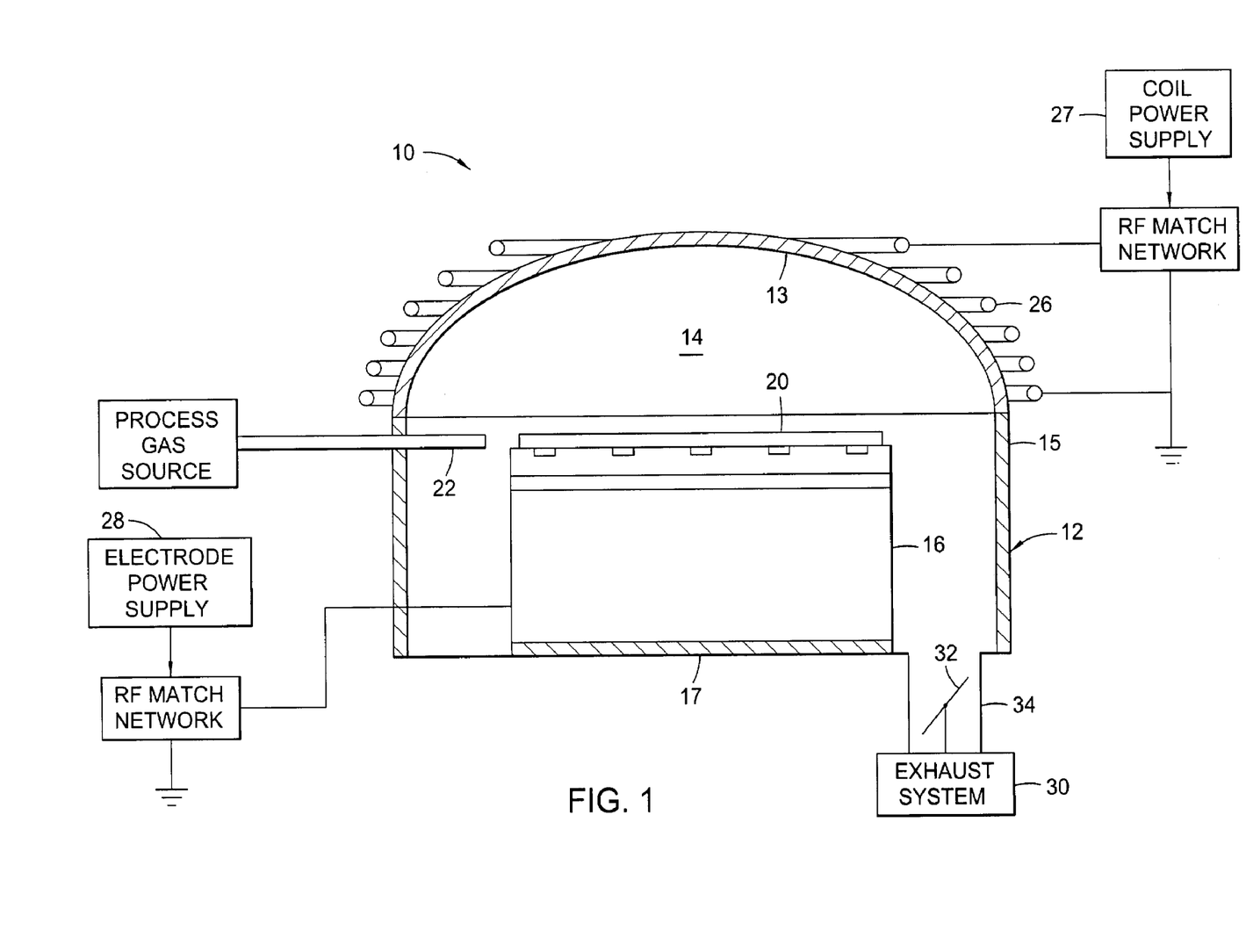
FIG. 1 is a schematic cross-sectional view of one embodiment of an etching chamber.

FIG. 1 is a schematic cross-sectional view of one embodiment of a processing chamber that may be used for performing the processes described herein. The processing chamber 10 generally includes a cylindrical sidewall or chamber body 12, an energy transparent dome ceiling 13 mounted on the body 12, and a chamber bottom 17. An inductive coil 26 is disposed around at least a portion of the dome 13. The chamber body 12 and the chamber bottom 17 of the processing chamber 10 can be made of a metal, such as anodized aluminum, and the dome 13 can be made of an energy transparent material such as a ceramic or other dielectric material.

A substrate support member 16 is disposed in the processing chamber 10 to support a substrate 20 during processing. The support member 16 may be a conventional mechanical or electrostatic chuck with at least a portion of the support member 16 being electrically conductive and capable of serving as a process bias cathode. While not shown, a reticle adapter may be used to secure the reticle on the support member 16. The reticle adapter generally includes a lower portion milled to cover an upper portion of the support member and a top portion having an opening that is sized and shaped to hold a reticle. A suitable reticle adapter is disclosed in U.S. Pat. No. 6,251,217, issued on Jun. 26, 2001, which is incorporated herein by reference to the extent not inconsistent with aspects and claims of the invention.

Processing gases are introduced into the processing chamber 10 from a process gas source (not shown) through a gas distributor 22 peripherally disposed about the support member 16. Mass flow controllers (not shown) for each processing gas, or alternatively, for mixtures of the processing gas, are disposed between the processing chamber 10 and the process gas source to regulate the respective flow rates of the process gases. The mass flow controllers can regulate up to about 1000 sccm flow rate for each processing gas or processing gas mixture.

A plasma zone 14 is defined by the process chamber 10, the substrate support member 16 and the dome 13. A plasma is formed in the plasma zone 14 from the processing gases using a coil power supply 27 which supplies power to the inductor coil 26 to generate an electromagnetic field in the plasma zone 14. The support member 16 includes an electrode disposed therein, which is powered by an electrode power supply 28 and generates a capacitive electric field in the processing chamber 10. Typically, RF power is applied to the electrode in the support member 16 while the body 12 is electrically grounded. The capacitive electric field is transverse to the plane of the support member 16, and influences the directionality of charged species more normal to the substrate 20 to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10. An optical endpoint measurement device can be connected to the processing chamber 10 to determine the endpoint of a process performed in the chamber.

While not shown, a controller for implementing processes described herein may be coupled to the processing chamber 10 or system containing the processing chamber 10, for instructing the system to perform one or more processing steps on the system, such as introducing gases into the chamber, striking a plasma, or repositioning the reticle. The controller may include a CPU, which CPU may be one of any form of computer processors that can be used in an industrial setting for controlling various chambers and subprocessors. Memory is coupled to the CPU, and the memory, or computer-readable medium, may be one or more of readily available memory, such as random access memory (RAM), read only memory (ROM), floppy disk, hard disk, or any other form of digital storage, local or remote. For storing information and instructions to be executed by the CPU.

The support circuits are coupled to the CPU for supporting the processor in a conventional manner. These circuits include cache, power supplies, clock circuits, input/output circuitry and subsystems, and can include input devices used with the controller, such as keyboards, trackballs, a mouse, and display devices, such as computer monitors, printers, and plotters. Such controllers are commonly known as personal computers; however, the present invention is not limited to personal computers and can be implemented on workstations, minicomputers, mainframes, and supercomputers.

Processes, such as the processes described herein, are generally stored in the memory, typically as a software routine. The software routine may also be stored and/or executed by a second CPU (not shown) that is remotely located from the hardware being controlled by the CPU.

While the following process description illustrates one embodiment of etching a substrate by the processing gases described herein, the invention contemplates the use of processing parameters outside the ranges described herein for performing this process in different apparatus, such as a different etching chamber, and for different substrate sizes, such as a photolithographic reticles for 300 mm substrate processing.

Etch Process Conditions

Examples of suitable photolithographic reticles for processing according to the processes described herein include an opaque layer known as a photomask, deposited on an optically transparent substrate. The opaque layer may comprise a metal or metal alloy, for example, chromium, chromium oxynitride and combinations thereof. The opaque layer may include any inorganic materials, such as silicon-based dielectrics including silicides, and any organic materials, such as polymeric materials, that may be opaque or block energy transmissions, such as UV light used in photolithographic processes known and unknown. The opaque layer is etched to produce a photomask layer having features with desired critical dimensions.

An optically transparent material of the substrate is broadly defined to include, but not limited to, a material transparent to lights having wavelengths of about 300 nm or less, for example, transparent to ultraviolet light having wavelengths of 248 nm and 193 nm. Examples of the optically transparent materials include calcium fluoride, alumina, sapphire, or an optically transparent silicon-based material such as optical quality quartz, molybdenum silicide, and molybdenum silicon oxynitride ($MoSi_xN_yO_z$).

The metal layer may be etched by a multi-step process having a plurality of reticle orientations to produce a photomask layer having features with uniform critical dimensions. The process involves a first etching step of positioning the substrate in a first orientation and etching to a desired etch depth of the photomask layer. The determination of the end of the first etch may be by an endpoint detection apparatus, such as an optical endpoint detection system, a computer program, or a desired etching time. The substrate is then repositioned in at a least a second orientation and the photomask layer is then further etched in at least a second etching step. For example, a two-step photomask layer etching process may be used with the processes described herein.

The number of steps and the amount of difference change in orientation may vary according to the degree of uniformity sought or the desires of the operator. For example, the substrate etch process may occur in two steps with a second orientation 180 degrees to the first orientation. In a further example, the substrate etch process may include four steps, with a change in orientation of 90 degrees between each step.

The etching process times may be distributed evenly or unevenly among the multiple etching steps. For example in the two-step etching process, a 100 second etching process may be divided into two durations of about 50 seconds each. Alternatively, the two-step etching process times may be "loaded" or distributed with more time allotted to a particular etch step with a desired orientation, such as 65 seconds for a first orientation and 35 seconds for a second orientation. Generally, the process times of each step are evenly divided among the number of steps.

Additionally, an overetch or residue etch step may also be performed at one or more of the orientations of the etching process. An overetch step may be performed to further etch residue material at the end of a final etch step or may be used at individual etch steps to provide for a finer or more precise etching depth or etching extent of critical dimensions. For example, an overetch step may be performed after a first etch at a first orientation, or after a second etch at a second orientation, or at a first orientation after the second step, or at a combination of all the orientations to ensure sufficient etching of the photomask layer. In another example, the overetch step may also be the second step of a two-step process with the photomask layer being substantially etched at a first orientation and an overetch step being performed at a second orientation.

The etching steps are performed by generating a plasma of one or more etching gases. Examples of suitable etching gases can include halogen containing gases, such as chlorine ($Cl_2$), carbon tetrachloride ($CCl_4$), and hydrogen chloride (HCl), oxygen containing gases, such as oxygen ($O_2$), carbon monoxide (CO), and carbon dioxide ($CO_2$), organic and substituted organic containing gases, such as $CH_4$ and $CHF_3$, and, optionally, an inert gas, such as argon (Ar) and/or helium (He). The processing gases for each etching step may have the same or different etching gas compositions. An example of a suitable etching gas and process is more fully described in U.S. patent application Ser. No. 10/024,958, filed on Dec. 18, 2001, which is incorporated herein by reference to the extent not inconsistent with the claimed aspects and disclosure herein. The described etching gases are illustrative, and should not be construed or interpreted as limiting the scope of the invention.

The total flow rate of the processing gases, including the inert gases, are introduced at a flow rate, for example, between about 100 sccm and about 1000 sccm for etching a 150 mm by 150 mm square photolithographic reticle in an etch chamber. Individual etching gases flow rates may vary, with a typical flow rate of between about 25 sccm and about 350 sccm for etching a 150 mm by 150 mm square photolithographic reticle in an etch chamber. The individual and total gas flows of the processing gases, may vary based upon a number of processing factors, such as the size of the processing chamber, the size of the substrate being processed, and the specific etching profile desired by the operator.

Generally, the processing chamber pressure is maintained between about 2 milliTorr and about 50 milliTorr for an etching process. A chamber pressure between about 5 milliTorr and about 35 milliTorr, preferably between about 15 milliTorr and about 32 milliTorr may be maintained during the etching process.

Generally, a source RF power level of about 1000 watts or less is applied to an inductor coil to generate and sustain a plasma of the processing gases during the etching process. A power level between about 300 watts and about 1000 watts, such as about 650 watts, has been observed to provide sufficient plasma of the processing gases for etching the substrate surface. Generally, a bias power of less than about 200 watts is applied to the substrate to increase directionality of the etching radicals with respect to the surface of the substrate. A bias power of less than 150 watts, such as between about 80 watts and about 120 watts, may be used in the etching process to provide sufficient directionality of etching radicals during the etching process.

The substrate temperature is maintained at about 150° C. or less during the etch process, for example between about 0° C. and about 50° C. A substrate temperature below about 150° C. or less has minimal heat degradation of materials, such as resist materials, deposited on the substrate during the photolithographic reticle fabrication processes, and it is also believed that a substrate temperature of about 150° C. helps regulate the etching process by limiting undesired chemical reactions. Additionally, the sidewalls of the processing chamber are maintained at a temperature of less than about 70° C. and the dome is maintained at a temperature of less than about 80° C. to maintain consistent processing conditions and to minimize polymer formation on the surfaces of the processing chamber.

The recited source RF and bias power levels have been observed to produce sufficient etching radicals and polymerization radicals from the processing gases to etch the exposed metal layer disposed on the substrate while providing a sufficiently low power level compared to prior art metal etch processes for the substrate temperatures to be about 150° C. or less.

The exposed material of a substrate surface may be etched by the plasma of the processing gases between about 10 seconds and about 600 seconds, for example, between about 80 seconds and about 250 seconds. The overetch process may expose the reticle to a plasma of an etching gas between about 5 seconds and about 200 seconds. The length of the etching process can vary based on the amount of material being etched, the thickness of the material to be etched, and the area of the material to be etched. The processing conditions described above are also illustrative and should not be construed or interpreted as limiting the scope of the invention.

The etching process described herein under the conditions disclosed herein preferably produce a removal rate ratio, i.e., selectivity or etch bias, of metal layer to resist of about 1:1 or greater. The increased selectivity results in the etching processes preserving the critical dimensions patterned in the photoresist layer and etching chromium features to have the desired critical dimensions.

The etching processes preferably remove horizontally disposed metal material, such as on the bottom of a feature or upper surface, at a greater rate than vertical or sidewall feature metal material, which results in anisotropic etching and improved feature formation. Additionally, the processes also preferably produce features with the desired critical dimension having an almost vertical profile, i.e., an angle of about 90° between the sidewall of the feature and the bottom of the feature.

Plasma Initiation

A plasma strike may be used to initiate or generate each plasma. The plasma strike is used to establish and stabilize a plasma of a processing gas prior to the initiation of the main process, for example, etching. The plasma strike may use a plasma strike gas containing the same gas composition as the processing gas for the process to be performed, such as the etching gas compositions described herein, or may be an inert gas composition.

When using an inert gas composition, it is believed that inert gas atoms, for example, helium atoms, are more likely to ionize greater and form more uniform plasma under processing conditions having equivalent power levels than other etching gases, such as chlorine atoms, oxygen atoms, or organic molecules as described herein. The ionization of helium allows for a plasma to be generated at higher chamber pressures and at lower source power and higher bias power as well as forming a stable plasma more rapidly than halogen containing gases, oxygen containing gases, and organic containing gases.

A processing gas for the plasma strike of an inert gas, and optionally, other processing gases as described herein generally comprises between about 75 vol % and about 100 vol % of an inert gas to initiate the plasma prior to introducing the etching processing gas. In one option, the plasma strike processing gas is introduced into a processing chamber and the flow rates of the gases are stabilized.

The plasma strike process comprises introducing and stabilizing the flow of a processing gas. The processing gas flow rates may be introduced into the processing chamber for less than 60 seconds, such as about 30 seconds, for stabilization of the processing gas flow rates. The chamber pressure is established between about 2 milliTorr and about 50 milliTorr, for example, between about 20 milliTorr and about 30 milliTorr.

The plasma strike is generated by first applying a bias to a substrate support, for example, at a range between about 1 watt and about 150 watts, such as between about 80 watts and about 120 watts, and then applying a source power, such as a source RF power, to a coil, for example, at a range between about 300 watts and about 1000 watts, such as about 700 watts. The application of the bias power may be applied before and during the application of the source power, or both the bias and source powers may be applied at the same instant for generating the plasma strike. The processing conditions and the plasma conditions of the plasma strike process may approximate those of the etching process with the processing gas described herein including total flow rates, chamber pressures, source power, and bias power. The plasma strike process may be for about 15 seconds or less, such as between about 1 and about 10 seconds.

The processing of the substrate may include a power application process of striking a plasma and then modifying the power level to that of the etching conditions. The source power used to strike the plasma may be greater than the power used during etching of the substrate. For example, striking a plasma at 650 watts and etching at 500 watts, stabilizing the power, and then performing the etch process. The power application process may be performed for a few seconds in which etching of the substrate surface may occur. After striking the plasma, the processing gas composition may be modified to that of the etching gas by reducing the inert gas flow rate and increasing the flow rate of the halogen containing gas and the oxygen containing gas.

Exemplary Multi-Step Etching

While the following description illustrates one embodiment of a process sequence for etching metal layers, such as chromium, used as photomasks in photolithographic reticle fabrication, it is contemplated that the etching gases and processing conditions may be used to etch other metal layers formed on substrates in semiconductor and photolithographic reticle manufacturing. Additionally, while the following description illustrates etching metal layers, the invention contemplates etching of dielectric layers, etching the optically transparent material of the substrate, and etching any phase-shift materials, such as molybdenum silicide (MoSi) and derivatives thereof, with the processes described herein. Further, while the following description illustrates a two-step process, the invention contemplates processes having more than two processing steps.

Figure 2:
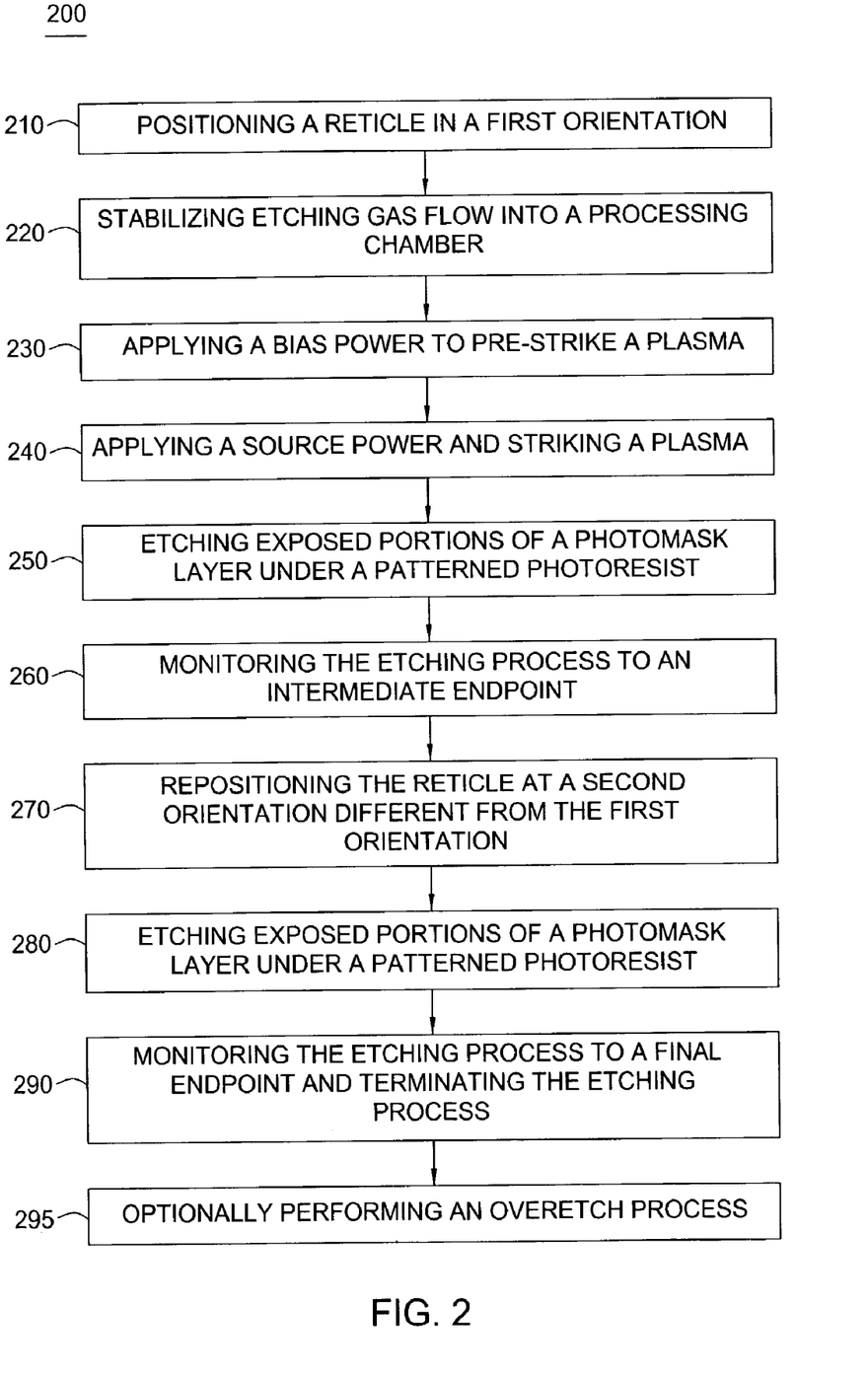
FIG. 2 is a flow chart illustrating one embodiment of a sequence for processing a substrate according to one embodiment of the invention.

FIG. 2 is a flow chart of one embodiment of one process sequence of an etching process 200. The flow chart is provided for illustrative purposes and should not be construed as limiting the scope of aspects of the invention. A reticle is positioned on a reticle support at a first orientation at step 210, in a processing chamber such as the DPS™ processing chamber 10 of FIG. 1. The substrate typically comprises an optically transparent material, such as optical quality quartz, molybdenum silicide, molybdenum silicon oxynitride ($MoSi_xN_yO_z$), calcium fluoride, alumina, sapphire, or combinations thereof, with an opaque metal layer as a metal photomask layer, typically comprising chromium, disposed on the optically transparent material.

The dimensions of openings or patterns to be formed in the photomask layer are patterned by depositing and patterning a resist material to expose the photomask layer. The resist materials used in photolithographic reticle fabrication are usually low temperature resist materials, which are described herein as materials that generally thermally degrade at temperatures above about 150° C., but in some cases may degrade at lower temperatures. Resist materials may be patterned optically, i.e., photoresist materials, or by another radiative energy patterning device, such as an ion beam emitter, an electric beam (e-beam), laser, or x-ray, for other types of resist materials.

A first processing gas comprising one or more etching gases is introduced into the processing chamber and a stabilized process gas flow is established at step 220 prior to generating a plasma. The plasma may be generated by a pre-strike and strike process steps. In a pre-strike step, a bias power is applied to the reticle support at step 230. The bias power may be about 150 watts or less. Then, a source power is applied to a coil disposed adjacent the processing chamber to strike a plasma at step 240. The source power may be between about 300 watts and about 700 watts. In an alternative version, the bias power and the source power may be applied at the same time, for examples steps 230 and 240 are initiated concurrently.

Openings and patterns are then etched in the photomask layer by the plasma of the first processing gas at step 250. The etching process is then monitored to an endpoint at step 260 and the process is ended at step 270. The endpoint of the etching process of step 250 is determined by several methods including an optical endpoint detection system, a computer program, or a desired etching time calculation, and the etching process is ended prior to etching the photomask layer to expose the underlying optically transparent material.

The etching process may be performed for a proportional period of time, for example approximately 50% of the time of the combined etch processes for this two-step etch process. The termination of the etching stop typically comprises ending the application of bias and source power and ending the flow of the etching gases into the processing chamber. An inert or cleaning gas may then be used to purge or clean the processing chamber. However, the etching process may be divided into two or more intervals that can be proportional or disproportional based upon the desires of the operator. Additionally, the process can be designed for the substrate to be repositioned in a new orientation and the etching continued without the need for ending the etch process. The repositioning of the reticle may be controlled as a parameter of a process, with a controller being programmed or programmable to receive as input the number of repositions and the extent of the orientation of the repositions of the substrate during the overall etching process.

The reticle is then repositioned in the processing chamber in a second orientation in step 280. The repositioning of the substrate may occur by several means including: positioning the reticle on a support, disposed adjacent the processing chamber, rotating the reticle by rotating the support, removing the reticle from the support, and positioning the reticle in the processing chamber; positioning the reticle on a support in a load lock chamber, rotating the reticle by rotating the support in the load lock chamber, repositioning the reticle in the same or different processing chamber; and positioning the reticle on a substrate handler blade, rotating the reticle by rotating the blade supporting the reticle, and positioning the reticle in the processing chamber.

The reticle may also be rotated in situ by rotating a substrate support supporting the reticle. In such instances the reticle may be rotated continuously during an etching process, or the etching process may be suspended, such as terminating gas flow or having no plasma generation, while the reticle is rotated in situ of the processing chamber, and then reinitiating the etching process. The above examples for repositioning the reticle in a second orientation are illustrative and should not be construed or interpreted. The above examples may be performed automatically or manually.

The repositioning of the reticle may be performed manually or automatically. In one aspect of an automatic repositioning, an orientation parameter may be inputted with other parameters, i.e., gas flow, power, etc. into a processing program, the process recipe, and the reticle repositioned as necessary according to the process recipe. A controller would receive input from the recipe, and adjust the position of the reticle, and modify other processing parameters accordingly. For example, a controller may receive data from a recipe that instructs rotating a reticle 180° at a predetermined time, such as approximately one-half the time of an etching process and signal a reticle support to rotate 180°. During the rotation, the controller can receive data to suspend certain processing parameters, such as power application or gas flow rates, to have the etching process minimized or suspended during rotation to minimize any potential defects in processing. The controller can be used to continuously rotate the substrate during the process, with the rotational speed and/or duration of exposure to an etching process at various orientations programmed into a recipe. A controller as described above may be used.

The second orientation, and subsequent orientations, may be radially translated from the first orientation between about 30° and about 180°. For a two-step etching process, the substrate is repositioned 180° from the first orientation for the second etch step.

Figure 4A:
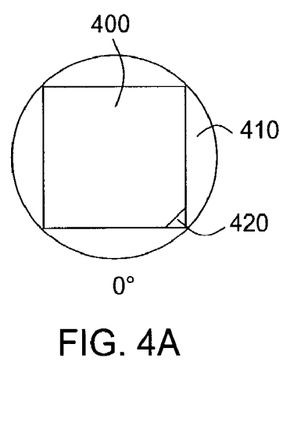
FIGS. 4A–4C are top schematic views showing a reticle on a substrate support at multiple orientations.
Figure 4B:
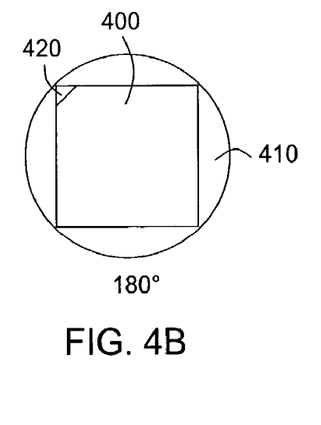
Figure 4C:
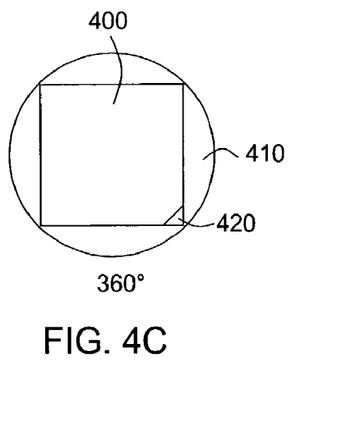
Figure 5A:
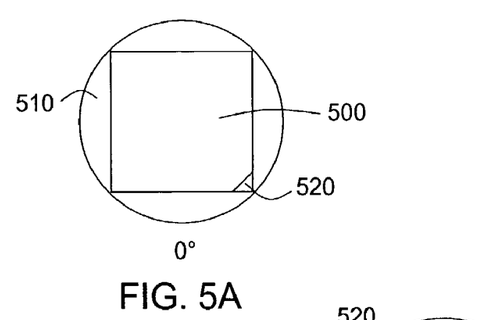
FIGS. 5A–5E are top schematic views showing a reticle on a substrate support at multiple orientations.
Figure 5B:
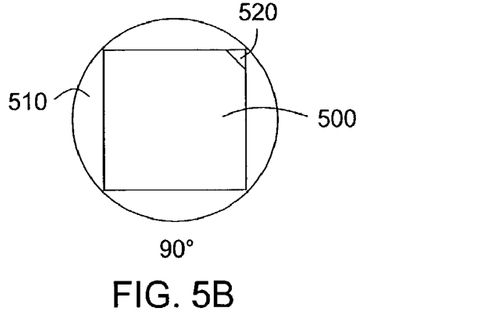
Figure 5C:
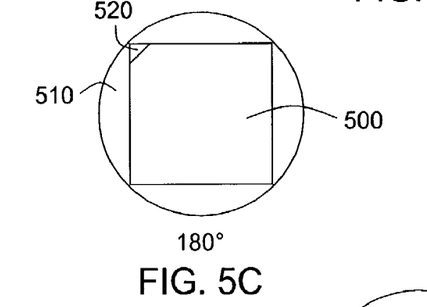
Figure 5D:
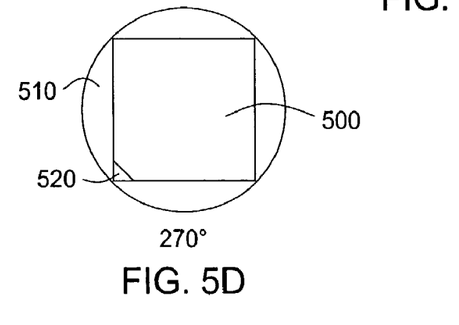
Figure 5E:
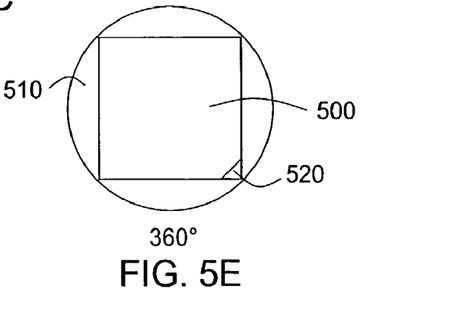

FIGS. 4A–4C and 5A–5E are top schematic views showing a substrate 400, 500, disposed in a reticle support 410, 510, with an alignment tab 420, 520, at multiple orientations. In FIG. 4A, reticle 400 is disposed in the reticle support of the processing chamber with the orientation tab 410 at a designated 0° orientation. FIG. 4B indicates that the reticle 400 has been rotated to a second orientation 180° to that of the first orientation for a second or continuing etching step. FIG. 4C indicates the reticle 400 has been rotated 180° for further processing, such as overetching, or for removal of the reticle 400 from the processing chamber.

FIGS. 5A–5E illustrate the rotation of the substrate in 90° increments for processing in a multi-step etching process. In such as example, the substrate in etched in four steps and for a duration of approximately one-fourth of the total etching process.

The orientations described in FIGS. 4A–4C and 5A–5E are provided for illustrative purposes and to provide a basis or orientation, and are not to be construed or interpreted as limiting the scope of the invention. For example, the initial orientation of the reticle in an etch process may be for example, 30°, 60°, 90°, etc . . . , with a variable amount of orientation change thereafter. Further, the invention contemplates that the change in orientation during etching may be limited in scope, for example, the reticle may be placed at an initial relative orientation of 60° with a second etching step at a relative orientation of 120°, and then ending the etching process for removal of the reticle.

The reticle may be then etched according to steps 220–250 in a second orientation to complete the formation of the features in the photomask layer at step 290. Optionally, a second resist may be applied and patterned on the substrate prior to the second etching process.

In an alternative embodiment, the first and second etching steps 250, 290, the rotating step, and the monitoring step 260, if necessary, may be performed in situ. The term "in situ" is intended to include in a given chamber, such as in a plasma chamber, or in a system, such as an integrated cluster tool arrangement, without exposing the material to intervening contamination environments and/or breaking vacuum. An in situ process typically minimizes process time and possible contaminants compared to relocating the substrate to other processing chambers or areas.

The second etch may be ended as described for the first etch in steps 260 and 270, and removed from the processing chamber in step 295.

Alternatively, an overetch step may be performed at step 275 and 292 after one or more of the etch steps 250, 290, of the two-step etching process to ensure removal of all of the desired material from the substrate or to finely define the features being etched therein. The overetch may use a different processing gas than the etch gases of the first two etching steps 250, 290. For example, one overetch step 275 may be performed after the first etching step 250, and another overetch may be performed at step 292 after second etching step 290. The overetch step 292 may be performed at the second orientation or the substrate may be repositioned at the first orientation prior to performing the overetch step 292.

Optionally, the substrate may then be further processed to etch the silicon-based materials for use as a phase-shift photolithographic reticle. The silicon-based material of the substrate is prepared for etching by depositing and patterning a second resist material on the metal photomask layer and exposed portions of silicon-based material. An example of etching of the optically transparent material, such as silicon-based material, of the substrate is more fully described in U.S. Pat. No. 6,319,790, issued on May 21, 2002, which is commonly owned and incorporated herein by reference to the extent not inconsistent with aspects of the invention.

FIGS. 3A–3E illustrate the composition of the photolithographic reticle prior to the etching steps as well as further illustrating the process described above in FIG. 2. A substrate 300, typically made of optical quality quartz material 310, is introduced into a processing chamber.

Figure 3A:
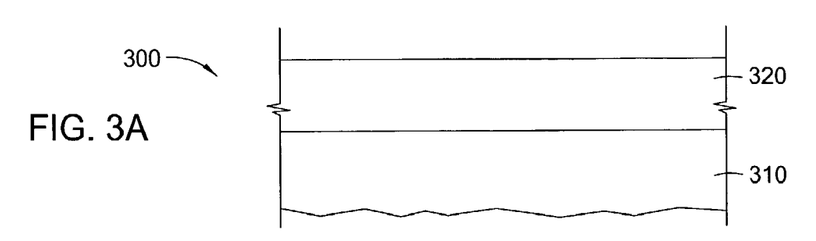
FIGS. 3A–3E are cross-sectional views showing an etching sequence of another embodiment of the invention.

A metal layer 320 made of chromium is deposited on the quartz material 310 as shown in FIG. 3A. The chromium layer may be deposited by conventional methods known in the art, such as by physical vapor deposition (PVD) or chemical vapor deposition (CVD) techniques. The chromium layer 320 is typically deposited to a thickness between about 50 and about 100 nanometers (nm) thick, however, the depth of the layer may change based upon the requirements of the manufacturer and the composition of the materials of the substrate or metal layer.

Figure 3B:
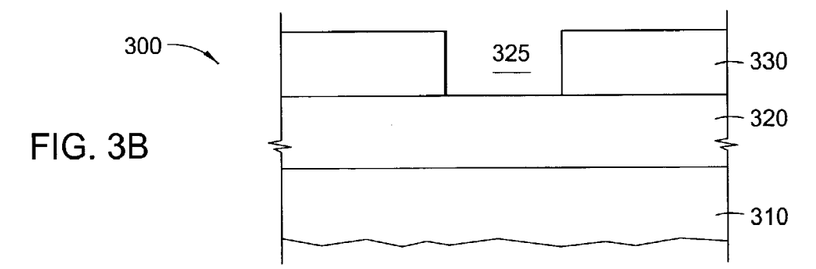

Referring to FIG. 3B, the substrate 300 is then transferred to another processing chamber where a layer of resist material 330, such as "RISTON," manufactured by DuPont de Nemours Chemical Company or others described herein, is deposited upon the chromium layer 320 to a thickness between about 200 and 600 nm thick. The resist material 330 is then pattern etched using conventional laser or electron beam patterning equipment to form a first opening 325 which is used to define the dimensions of the second opening 335 to be formed in the chromium layer 320.

Figure 3C:
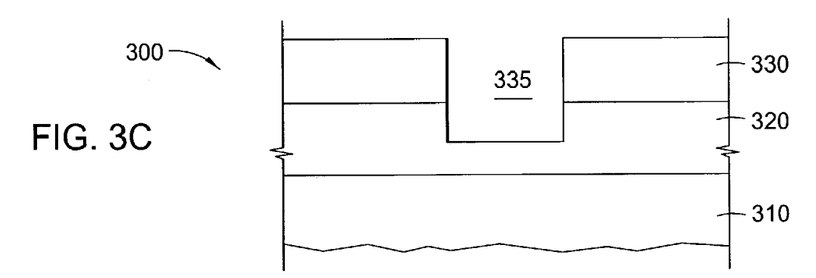

The substrate 300 is then transferred to an etch chamber, such as the DPS™ processing chamber 10 described above, and the chromium layer 320 is first etched to a first depth at a first orientation to form second opening 335 as shown in FIG. 3C.

An exemplary processing regime for a chromium layer with the first processing gas described herein is as follows. The substrate is placed on the support member 16, and a processing gas is introduced into the chamber and plasma is generated to etch the chromium layer 320.

The processing gas for etching the chromium layer includes chlorine gas ($Cl_2$), oxygen gas ($O_2$), and helium, having a total flow rate between about 100 sccm and about 400 sccm during the etching process. Generally, the processing chamber pressure is maintained between about 5 milliTorr and about 30 milliTorr, for example about 10 milliTorr. A source RF power between about 300 watts and about 700 watts, for example 400 watts, is applied to an inductor coil to generate and sustain a plasma of the processing gases during the etching process. A bias power between about 1 watt and about 100 watts, for example about 30 watts, is applied to the substrate support. The first etch step is performed between about 30 seconds and about 150 seconds, or approximately one-half the total etching time, for example about 60 seconds.

The substrate temperature is between about 20° C. and about 100° C. during the etching process. Additionally, the sidewalls 15 of the processing chamber 10 are maintained at a temperature of less than about 70° C. and the dome is maintained at a temperature of less than about 80° C.

Figure 3D:
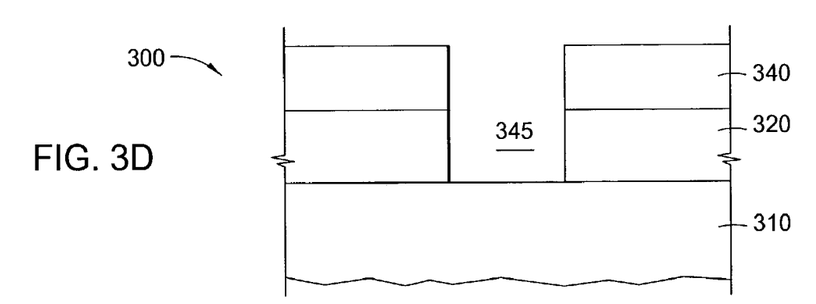

Referring to FIG. 3D, the substrate 300 is then repositioned in the etch chamber at a second orientation of about 180° rotation from the first orientation, and the chromium layer 320 is then etched to a second depth at the second orientation to form third opening 345. The second depth is generally sufficient to expose the underlying material 310. The second etch is generally performed under the same etch gases and etch conditions as the first etch step. Resist material 340 may be any remaining resist material 330 or comprise a new photoresist material in part or whole. In embodiments having a new photoresist material being added, previous amounts of resist material may be removed from the substrate surface from an ashing process or other known photoresist removal process.

Figure 3E:
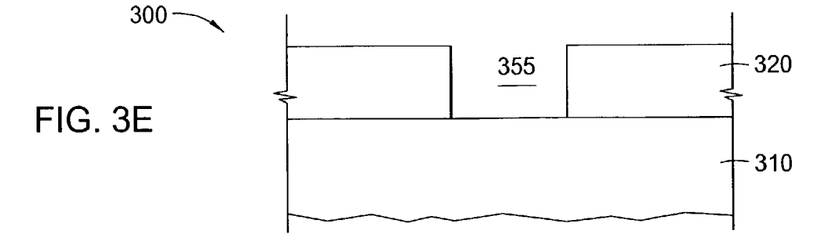

Referring to FIG. 3E, after etching of the chromium layer 320 is completed, the substrate 300 is transferred to a processing chamber, and the remaining resist material 330 is usually removed from the substrate 300, such as by an oxygen plasma process, or other resist removal technique known in the art.

If an optional overetch process is used, the substrate may be performed immediately after the second etch, or the substrate 300 may be repositioned 180°, and the overetch is performed prior to removal of the substrate from the processing chamber. Generally, the processing conditions for the overetch process are the same as for the first or second etch of the metal photomask layer, however, processing conditions may be used as follows. The processing chamber pressure is maintained between about 5 milliTorr and about 30 milliTorr, for example about 10 milliTorr. A source RF power between about 300 watts and about 700 watts, for example 400 watts, is applied to an inductor coil to generate and sustain a plasma of the processing gases during the etching process. A bias power between about 1 watt and about 100 watts, for example about 30 watts, is applied to the substrate support. The overetching process is performed between about 5 seconds and about 60 seconds.

The above described processing gas compositions and two-step processing regime are believed to provide uniform etching of openings or patterns with desired critical dimensions in the photomask layer across the surface of the reticle.

EXAMPLE OF ETCHING PROCESS

An example of the etching process with orientation change is as follows. A reticle is placed in a plasma etch chamber as described above in an initial 0° orientation as shown in FIG. 4A.

Processing gases are introduced into the chamber, and the process gas flow is allowed to stabilize by introducing oxygen at a flow rate of about 63 sccm into the processing chamber, introducing chlorine at a flow rate of about 170 sccm into the processing chamber, introducing helium at a flow rate of about 12 sccm into the processing chamber, maintaining a chamber pressure at about 20 millitorr, maintaining a wall temperature of 70° C., maintaining a substrate support temperature of 30° C., and maintaining a dome temperature of 30° C. for a period of twenty (20) seconds.

A pre-strike step is performed by applying a bias power of 100 watts for 5 seconds when introducing oxygen at a flow rate of about 63 sccm into the processing chamber, introducing chlorine at a flow rate of about 170 sccm into the processing chamber, introducing helium at a flow rate of about 12 sccm into the processing chamber, maintaining a chamber pressure at about 20 millitorr, maintaining a wall temperature of 70° C., maintaining a substrate support temperature of 30° C., and maintaining a dome temperature of 30° C.

Next, a strike process is performed to provide the proper conditions for etching by applying a source power of 700 watts and a bias power of 50 watts for 5 seconds when introducing oxygen at a flow rate of about 63 sccm into the processing chamber, introducing chlorine at a flow rate of about 170 sccm into the processing chamber, introducing helium at a flow rate of about 12 sccm into the processing chamber, maintaining a chamber pressure at about 20 millitorr, maintaining a wall temperature of 70° C., maintaining a substrate support temperature of 30° C., and maintaining a dome temperature of 30° C.

The reticle is then etched to a pre-determined endpoint by applying a source power of 650 watts, a bias power of 30 watts, introducing oxygen at a flow rate of about 63 sccm into the processing chamber, introducing chlorine at a flow rate of about 170 sccm into the processing chamber, introducing helium at a flow rate of about 12 sccm into the processing chamber, maintaining a chamber pressure at about 20 millitorr, maintaining a wall temperature of 70° C., maintaining a substrate support temperature of 30° C., and maintaining a dome temperature of 30° C. for a period of 600 seconds.

Optionally, an overetch process may be performed by applying a source power of 650 watts, a bias power of 30 watts, introducing oxygen at a flow rate of about 63 sccm into the processing chamber, introducing chlorine at a flow rate of about 170 sccm into the processing chamber, introducing helium at a flow rate of about 12 sccm into the processing chamber, maintaining a chamber pressure at about 20 millitorr, maintaining a wall temperature of 70° C., maintaining a substrate support temperature of 30° C., and maintaining a dome temperature of 30° C. for a period of 635.8 seconds.

The process chamber may then be pumped down and the substrate repositioned in a second orientation, for example 180° as shown in FIG. 4B. the process described above may then be repeated. After the second etch process, the substrate may then be reoriented to the original position, such as shown in FIG. 4C, and an optional overetch process may be performed as described above prior to removal of the substrate from the processing chamber.

While the foregoing is directed to the exemplary aspects of the invention, other and further aspects of the invention may be devised without departing from the basic scope thereof, and the scope thereof is determined by the claims that follow.

What is claimed is:

1. A method for processing a photolithographic reticle, comprising:
   positioning the reticle in a first orientation, wherein the reticle comprises a metal photomask layer formed on an optically transparent substrate, and a patterned resist material deposited on the metal photomask layer;
   etching exposed portions of the metal photomask layer in the first orientation;
   rotating the reticle in at least a second orientation; and
   etching the exposed portions of the metal photomask layer in the at least second orientation.

2. The method of claim 1, wherein the metal photomask layer comprises chromium, chromium oxynitride, and combinations thereof.

3. The method of claim 1, wherein the optically transparent substrate comprises a silicon-based material selected from the group of quartz, molybdenum silicide, molybdenum silicon oxynitride, and combinations thereof.

4. The method of claim 1, wherein etching the metal photomask layer comprises:
   introducing one or more etching gases into the chamber;
   stabilizing flow rates of the one or more etching gases;
   applying a bias power to the reticle support; and
   applying a source power to a coil in the processing chamber to generate a plasma of the one or more etching gases.

5. The method of claim 1, wherein applying the source power comprises applying a source RF power between about 300 watts and about 1000 watts is applied to the coil in the processing chamber.

6. The method of claim 5, further comprising applying a bias power to the support member of about 150 watts or less.

7. The method of claim 1, further comprising overetching the exposed portions of metal photomask layer.

8. The method of claim 7, wherein etching the reticle in the first orientation further comprises overetching the exposed portions of metal photomask layer prior to rotating the reticle in the second orientation.

9. The method of claim 1, wherein rotating the reticle in the second orientation comprises rotating the reticle between about 30° and about 180° from the first orientation.

10. The method of claim 1, wherein rotating the reticle in a second orientation comprises rotating the reticle by rotating a reticle support supporting the reticle.

11. The method of claim 1, wherein rotating the reticle in the second orientation comprises positioning the reticle on a support disposed adjacent the processing chamber, rotating the reticle by rotating the support, removing the reticle from the support disposed adjacent the processing chamber, and positioning the reticle in the processing chamber.

12. The method of claim 1, wherein rotating the reticle in the second orientation comprises positioning the reticle on a support in a load lock chamber, rotating the reticle by rotating the support, removing the reticle from the load lock, and positioning the reticle in the processing chamber.

13. The method of claim 1, wherein rotating the reticle in a second orientation comprises positioning the reticle on a substrate handler blade, rotating the reticle by rotating the blade supporting the reticle, and positioning the reticle in the processing chamber.

14. The method of claim 1, wherein rotating the reticle in the second orientation and etching the reticle in the second orientation are performed concurrently.

15. The method of claim 1, wherein etching the exposed portions of the metal photomask layer in the first orientation, rotating the reticle in the second orientation, and etching the exposed portions of the metal photomask layer in the second orientation are performed in situ.

16. The method of claim 1, wherein the step of positioning the reticle in a first orientation and rotating the reticle in at least a second orientation are included in a computer readable medium bearing instructions for processing a photolithographic reticle, wherein the instructions are arranged so that when executed by one or more processors, the instructions cause the one or more processors to position the reticle in a first orientation and then rotate the reticle in at least a second orientation.

17. A method for processing a photolithographic reticle, comprising:

positioning the reticle in a first orientation on a reticle support in a processing chamber, wherein the reticle comprises a metal photomask layer formed on an optically transparent substrate, and a patterned resist material deposited on the metal photomask layer;

etching the exposed portions of the metal photomask layer in the first orientation;

positioning the reticle in a second orientation 180° from the first orientation;

etching the exposed portions of the metal photomask layer in the second orientation;

positioning the reticle in the first orientation; and etching the exposed portions of the metal photomask layer to remove any residual metal photomask layer.

18. The method of claim 17, wherein the metal photomask layer comprises a material selected from the group of chromium, chromium oxynitride, and combinations thereof, and the optically transparent substrate comprises a silicon-based material selected from the group of quartz, molybdenum suicide, molybdenum silicon oxynitride, and combinations thereof.

19. The method of claim 17, wherein etching the reticle comprises introducing a processing gas to the processing chamber and generating a plasma by applying a source RF power between about 300 watts and about 1000 watts and applying a bias power to the support member of about 150 watts or less to a coil in the processing chamber.

* * * * *

UNITED STATES PATENT AND TRADEMARK OFFICE
CERTIFICATE OF CORRECTION

PATENT NO. : 7,077,973 B2 Page 1 of 1
APPLICATION NO. : 10/418673
DATED : July 18, 2006
INVENTOR(S) : Alex Buxbaum and Bjom Skyberg It is certified that error appears in the above-identified patent and that said Letters Patent is hereby corrected as shown below:

<u>In the Specification</u>

Column 4, Line 52: Change "remote. For" to --remote, for--

Column 5, Line 45: Change "in at a least" to --in at least--

Column 10, Line 56: After "such", change "as" to --an--

Column 10, Line 56: After substrate", change "in" to --is--

Column 14, Line 6: Before "process", change "the" to --The--

<u>In the Claims</u>

Column 16, Claim 18, Line 20: Change "suicide" to --silicide--

Signed and Sealed this

Fourteenth Day of November, 2006

JON W. DUDAS
*Director of the United States Patent and Trademark Office*